(12) United States Patent
Kwasniewski et al.

(10) Patent No.: US 7,843,275 B1
(45) Date of Patent: Nov. 30, 2010

(54) FREQUENCY SYNTHESIZER CIRCUITRY EMPLOYING DELAY LINE

(75) Inventors: Tad Kwasniewski, Ottawa (CA); Jingcheng Zhuang, Dallas, TX (US); Qingjin Du, Dallas, TX (US)

(73) Assignee: Altera Corporation, San Jose, CA (US)

( * ) Notice: Subject to any disclaimer, the term of this patent is extended or adjusted under 35 U.S.C. 154(b) by 94 days.

(21) Appl. No.: 11/975,457

(22) Filed: Oct. 19, 2007

Related U.S. Application Data

(60) Provisional application No. 60/922,181, filed on Apr. 6, 2007.

(51) Int. Cl.
*H03K 3/03* (2006.01)
*H03L 7/24* (2006.01)

(52) U.S. Cl. ............................. 331/57; 331/55; 331/186

(58) Field of Classification Search .................... 331/55, 331/57, 186
See application file for complete search history.

(56) References Cited

U.S. PATENT DOCUMENTS

| 5,636,254 A | * | 6/1997 | Hase et al. | 375/371 |
| 6,445,253 B1 | * | 9/2002 | Talbot | 327/172 |
| 2008/0143407 A1 | * | 6/2008 | Schrom et al. | 327/172 |

* cited by examiner

*Primary Examiner*—Benny Lee
*Assistant Examiner*—James E Goodley
(74) *Attorney, Agent, or Firm*—Ropes & Gray LLP; Robert R. Jackson

(57) ABSTRACT

Frequency synthesizer circuitry employs a delay line. A reference clock signal propagates through successive stages of the delay line, and the currents drawn by output buffers of all of the stages are added at a common node. The common node current is converted to a voltage, which is AC-coupled to an output buffer ring oscillator of the frequency synthesizer. The output buffer ring oscillator includes a plurality of inverters connected in a series. A feedback connection including a resistor is provided from an output node of the last inverter to an input node of the first inverter.

14 Claims, 1 Drawing Sheet

FREQUENCY SYNTHESIZER CIRCUITRY EMPLOYING DELAY LINE

This application claims the benefit of U.S. provisional patent application 60/922,181, filed Apr. 6, 2007, which is hereby incorporated by reference herein in its entirety.

BACKGROUND OF THE INVENTION

This invention relates to frequency synthesizer circuitry, and more particularly to frequency synthesizer circuitry that employs a delay line.

Frequency synthesizer circuitry that is based on a delay-locked loop (DLL) typically exhibits better phase noise performance than its phase-locked loop (PLL) counterpart because it has no noise accumulation. A delay line is used in a DLL-based frequency synthesizer, and outputs of delay stages are combined together to produce an output signal of the frequency synthesizer. Such combining of the delay stage outputs may be referred to as edge combining. Edge combining is traditionally achieved using a large number of logical gates, and it typically results in a complex circuit, especially for frequency synthesizers having a large frequency ratio.

SUMMARY OF THE INVENTION

DLL-based frequency synthesizer circuitry in accordance with this invention employs a relatively simple edge combining implementation. It also has low power consumption, and it significantly reduces the possibility of introducing noise into the edge combining process. Frequency synthesizer circuitry in accordance with this invention may include delay line circuitry that has a plurality of successive stages through which a reference clock signal successively propagates. Each of the stages has an output buffer, which draws an amount of current indicative of the state of the reference clock signal currently in that stage. Circuitry is provided for adding together the currents drawn by the output buffers of all of the stages and for providing an intermediate signal that is indicative of the result of adding the output buffer currents. Fluctuations in the intermediate signal are used by output buffer ring oscillator circuitry of the frequency synthesizer to produce a final output signal having a frequency that is responsive to the frequency of the fluctuations. For example, the final output signal frequency may be an integer multiple of the intermediate signal fluctuation frequency.

Method aspects of the invention may involve synthesizing a frequency from a reference clock signal by passing the reference clock signal through successive stages of a delay line, adding together currents drawn by output buffers of the stages to produce an intermediate signal, and using fluctuations in the intermediate signal to produce a final output signal having a frequency that is based, at least in part, on the intermediate signal fluctuation frequency.

Further features of the invention, its nature and various advantages, will be more apparent from the accompanying drawings and the following detailed description.

DETAILED DESCRIPTION

Figure 1:
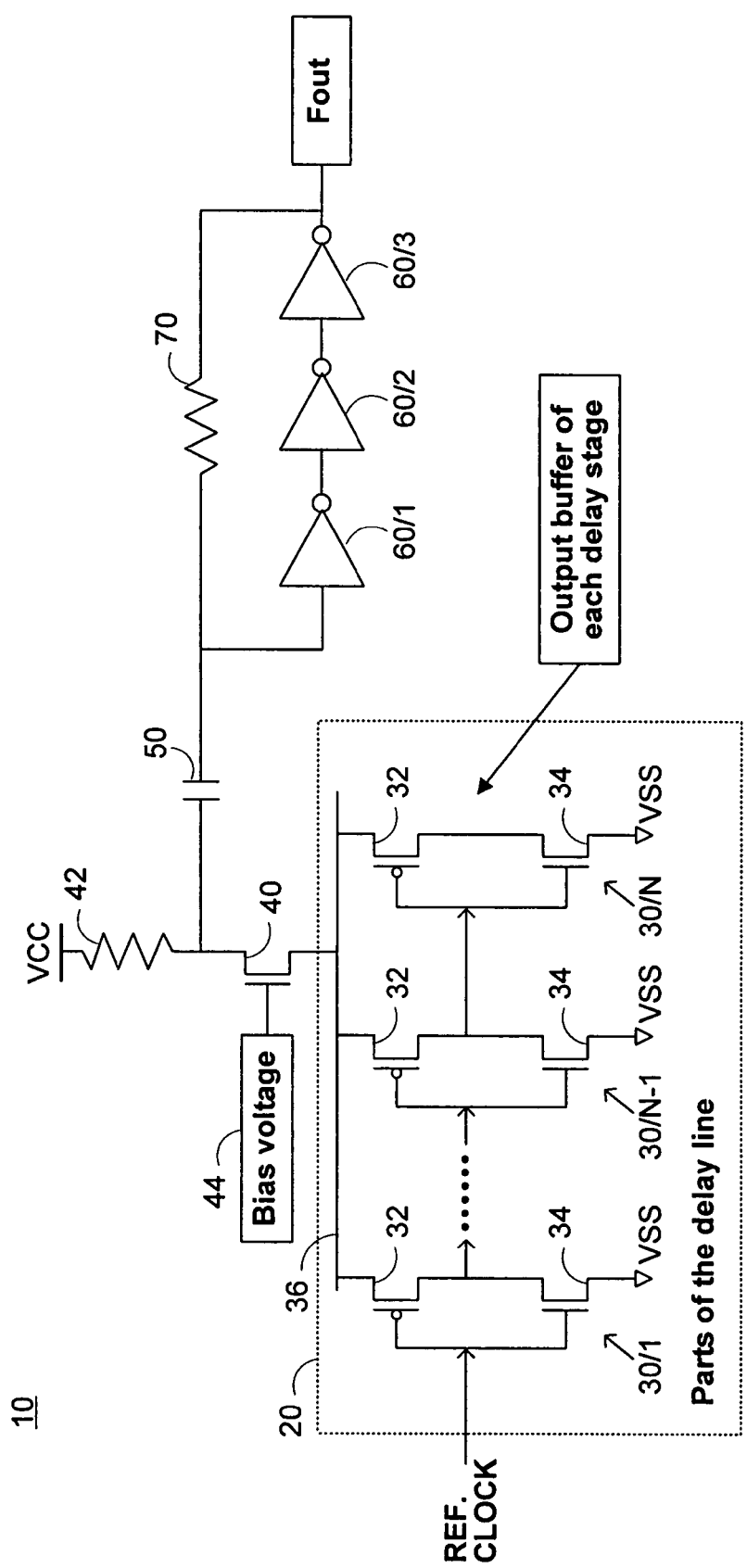
FIG. 1 is a simplified schematic block diagram of an illustrative embodiment of circuitry constructed in accordance with the invention.

Illustrative frequency synthesizer circuitry 10 in accordance with the invention is shown in FIG. 1. Circuitry 10 includes a delay line 20, of which representative parts are shown. In particular, FIG. 1 shows the output buffers 30/1, 30/N-1, and 30/N of several representative stages of delay line 20. For example, delay line 20 may include 64 stages or any other desired number of stages. Each output buffer 30 includes a PMOS transistor 32 connected in series with an NMOS transistor 34 between a current-adding rail or node 36 and ground (VSS). Current-adding node 36 is common to all of output buffers 30. The current drawn by all of output buffers 30 is therefore added by or on rail 36.

A reference clock signal propagates through delay line 20. Each stage of the delay line inverts and delays that signal by a small amount before applying it to the next successive stage. (Although FIG. 1 only shows the output buffer 32/34 of each delay line stage, it will be understood that each stage of the delay line may also include other circuitry upstream from the output buffer 32/34 of that stage. It will also be understood that delay line 20 may be locked, if desired, by looping an output signal of the delay line back for use by circuitry that drives the delay line.)

In the unlocked case (in which the total delay of delay line 20 is less than the period of the reference clock signal), propagation of a transition (edge) in the reference clock signal along the delay line toggles the number of output buffers 30 that are drawing non-zero current amounts from current-adding or edge-combining rail 36. For example, the output buffer 32/34 of a delay line stage that is currently outputting a logic zero signal to the next stage draws little or no current from node 36. On the other hand, the output buffer 32/34 of a delay line stage that is currently transitioning toward a logic one signal (driving the next stage) draws significant current from node 36.

Edge-combining rail 36 is connected to power supply VCC via series-connected resistor 42 and NMOS transistor 40. Bias voltage source 44 keeps transistor 40 on to the desired degree. Accordingly, the above-described toggling of the current drain on edge-combining rail 36 causes corresponding fluctuation in the voltage at the node between resistor 42 and transistor 40. In other words, the total current drawn from edge-combining rail 36 by output buffers 30 is converted to a voltage at the node between elements 40 and 42 (which elements form a voltage divider circuit).

The voltage at the node between elements 40 and 42 is AC coupled by capacitor 50 to a frequency synthesizer output buffer circuit that includes an odd number of serially connected inverters 60/1, 60/2, and 60/3, with a feedback resistor 70 to maintain a correct DC voltage at the input node of first inverter 60/1 and to act as a duty cycle corrector. (The example shown in FIG. 1 is similar to a single-ended ring oscillator, which has an odd number of inverters 60. An alternative embodiment employing a differential ring oscillator is described later in this specification.) The synthesized-frequency output signal Fout is available at the output terminal of the last inverter 60/3. Use of three inverters 60 as shown in FIG. 1 is only an example, and any other odd number of inverters 60 could be used instead (i.e., in other single-ended ring oscillator embodiments), if desired. It will be understood that Fout typically has a synthesized frequency that is higher than the input reference clock signal frequency.

From the foregoing it will be seen that the edge-combining implementation of this invention is relatively simple. It does not require a large number of logical gates or other complex circuitry, even for frequency synthesizers having a large frequency ratio.

The frequency synthesizer of this invention has very low power consumption, and it significantly reduces the possibility of introducing noise in the edge-combining process.

It will be understood that the foregoing is only illustrative of the principles of this invention, and that various modifications can be made by those skilled in the art without departing from the scope and spirit of the invention. For example, the number of delay stages employed in delay line 20 can be more or less than the number in the specific example mentioned earlier in this specification. As another example, the frequency synthesizer output buffer (referring to elements like 60 and 70 in FIG. 1) can be any type of ring oscillator in which a resistor (like 70) is inserted into the feedback loop. The result is an amplifier/bandpass-filter, because ring oscillators also form a bandpass filter. Among the possible alternative ring oscillator types are differential ring oscillators. These can be constructed with cross-coupled outputs and an even number of differential inverter stages.

It should be noted that the ring oscillator 60/70 can play the role of an amplifier of the signal coupled through capacitor 50. If there is a sufficient inverting gain and signal inversion in the loop, the ring oscillator 60/70 would, however, oscillate at a frequency 1/3*td, where td is a delay of inverter stages 60/1, 60/2, and 60/3. If sufficient coupling of signal from delay line 20 occurs through elements 40, 42, and 50, the ring oscillator 60/70 would oscillate at a frequency that is three times higher than the frequency of pulses arriving through capacitor 50. A frequency multiplication can thereby be achieved, and its value equals the number of stages 60 in the ring oscillator.

Another possibly significant effect that should be noted is that due to phase instances memory (also referred to as phase accumulation), in the ring oscillator 60/70, noise of ring oscillator pulses (specifically noise due to mismatched, unequal delays of delay line stages 30) would be averaged and thus lowered in amplitude. Although additional noise might be added by the ring oscillator 60/70 circuitry itself, the overall output noise (edge transition jitter) may be improved.

The invention claimed is:

1. Frequency synthesizer circuitry comprising:
   delay line circuitry having a plurality of successive stages through which a reference clock signal successively propagates, each of the stages including an output buffer that draws an amount of current indicative of a state of the reference clock signal currently in that stage;
   circuitry for adding the currents drawn by the output buffers and for producing an intermediate signal indicative of a result of the adding; and
   further output buffer ring oscillator circuitry for using fluctuations in the intermediate signal to produce a final output signal having frequency responsive to the fluctuations, wherein the further output buffer ring oscillator circuitry comprises:
      an AC coupling capacitor for passing an AC component of the intermediate signal;
      a plurality of inverters through which the AC component is passed in series; and
      a feedback connection including a resistor from an output of a last of the plurality of inverters to an input of a first of the plurality of inverters.

2. The circuitry defined in claim 1 wherein each successive stage of the delay line circuitry delays and inverts the reference clock signal.

3. The circuitry defined in claim 1 wherein the circuitry for adding comprises:
   a common node from which the output buffers of all of the stages draw their currents.

4. Frequency synthesizer circuitry comprising:
   delay line circuitry having a plurality of successive stages through which a reference clock signal successively propagates, each of the stages including an output buffer that draws an amount of current indicative of a state of the reference clock signal currently in that stage;
   a common node for adding the currents drawn by the output buffers;
   a resistor and a transistor connected in series between a power supply and the common node and a further node between the resistor and the transistor for producing an intermediate signal indicative of a result of the adding; and
   further output buffer ring oscillator circuitry for using fluctuations in the intermediate signal to produce a final output signal having frequency responsive to the fluctuations.

5. The circuitry defined in claim 4 wherein the further output buffer ring oscillator circuitry comprises:
   an AC coupling capacitor for passing an AC component of the intermediate signal;
   a plurality of inverters through which the AC component is passed in series; and
   a feedback connection including a further resistor from an output of a last of the inverters to an input of a first of the inverters.

6. A method of synthesizing a frequency from a reference clock signal comprising:
   passing the reference clock signal through successive stages of a delay line;
   adding currents drawn by output buffers of the stages to produce an intermediate signal; and
   using fluctuations in the intermediate signal to produce a final output signal having a frequency that is based, at least in part, on frequency of the fluctuations, wherein the using comprises:
      extracting an AC component from the intermediate signal;
      passing the AC component through a plurality of inverters; and
      feeding back an output signal of a last of the plurality of inverters through a resistor to an input of a first of the plurality of inverters.

7. The method defined in claim 6 further comprising:
   delaying and inverting the reference clock signal in each of the stages.

8. The method defined in claim 6 wherein the adding comprises:
   converting a total current, resulting from the adding currents, to a voltage for the intermediate signal.

9. Frequency synthesizer circuitry comprising:
   a plurality of delay line stages connected in a series, each stage delaying and inverting a reference clock signal it receives from a preceding stage in the series, and each stage having an output buffer;
   a common node for adding current drawn by the output buffers;
   a voltage divider circuit for converting current at the common node to voltage of an intermediate signal, wherein the voltage divider circuit comprises a resistor connected in series with a transistor; and
   further output buffer ring oscillator circuitry for converting an AC component of the intermediate signal to a final output signal having a synthesized frequency.

10. The circuitry defined in claim 9 further comprising:
    a node between the resistor and the transistor for providing the intermediate signal.

11. The circuitry defined in claim 9 wherein the further output buffer circuitry comprises:
    an AC coupling capacitor for extracting the AC component from the intermediate signal.

12. The circuitry defined in claim 11 wherein the further output buffer ring oscillator circuitry further comprises:
   a plurality of inverters connected in a series through which the AC component is successively passed.

13. The circuitry defined in claim 12 wherein the further output buffer ring oscillator circuitry further comprises:
   a feedback connection including a resistor from an output of a last one of the inverters to an input of a first one of the inverters.

14. A method of synthesizing a frequency from a reference clock signal comprising:
   passing the reference clock signal through successive stages of a delay line;
   adding currents drawn by output buffers of the stages to produce an intermediate signal;
   providing the intermediate signal using a voltage divider comprising a resistor and a transistor connected in series; and
   using fluctuations in the intermediate signal to produce a final output signal having a frequency that is based, at least in part, on frequency of the fluctuations.

* * * * *